(12) United States Patent
Dhablania

(10) Patent No.: US 6,415,308 B1
(45) Date of Patent: Jul. 2, 2002

(54) CONVERTING NEGATIVE FLOATING POINT NUMBERS TO INTEGER NOTATION WITHOUT TWO'S COMPLEMENT HARDWARE

(75) Inventor: Atul Dhablania, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/377,099

(22) Filed: Aug. 19, 1999

(51) Int. Cl.[7] .................................................. G06F 7/00
(52) U.S. Cl. ....................................................... 708/204
(58) Field of Search ................................ 708/204, 205, 708/209, 495, 496, 497, 505, 550, 551

(56) References Cited

U.S. PATENT DOCUMENTS

| | | |
|---|---|---|
| 4,949,291 A | 8/1990 | Saini |
| 5,040,138 A | 8/1991 | Maher, III |
| 5,144,570 A | 9/1992 | Maher, III |
| 5,161,117 A | 11/1992 | Waggener, Jr. |
| 5,257,215 A | 10/1993 | Poon |
| 5,272,654 A | 12/1993 | Nix |
| 5,508,948 A * | 4/1996 | Hatta .......................... 708/204 |
| 5,561,615 A | 10/1996 | Kuo et al. |
| 5,584,009 A | 12/1996 | Garibay, Jr. et al. |
| 5,619,198 A | 4/1997 | Blackham et al. |
| 5,633,819 A | 5/1997 | Brashears et al. |
| 5,644,741 A | 7/1997 | Bluhm et al. |
| 5,652,584 A | 7/1997 | Yoon |
| 5,835,967 A | 11/1998 | McMahan |
| 6,151,612 A * | 11/2000 | Song .......................... 708/204 |

OTHER PUBLICATIONS

*Leading–Zero Anticipatory Logic for High–Speed Floating Point Addition*, by Hiroaki Suzuki Hiroyuki Morinaka, Hiroshi Makino, Yashunobu Nakase, Koichiro Mashiko, Member IEEE, and Tadashi Sumi, IEEE Journal of Solid–State Circuits, vol. 31, No. 8, Aug. 1996.

Hokenek and Montoye in "Leading–zero Anticipator (LZA) in the IBM RISC System/6000 Floating–point Execution Unit", IBM J. Res. Develop., vol. 34, No. 1, Jan. 1990.

\* cited by examiner

*Primary Examiner*—Chuong Dinh Ngo
(74) *Attorney, Agent, or Firm*—John L. Maxin

(57) ABSTRACT

For use in a processor having integer and floating point execution cores, logic circuitry for, and a method of, converting negative numbers from floating point notation to integer notation. In one embodiment, the logic circuitry includes: (1) a shifter that receives a number in floating point notation and shifts a fraction portion of the received number as a function of an exponent portion thereof to yield a shifted fraction portion and rounding data, (2) a one's complementer, coupled to the shifter, that inverts the shifted fraction portion to yield an unincremented inverted shifted fraction portion, (3) an incrementer, coupled to the one's complementer, that increments the unincremented inverted shifted fraction portion to yield an incremented inverted shifted fraction portion and (4) a multiplexer, coupled to the one's complementer and the incrementer, that selects one of the unincremented inverted shifted fraction portion and the incremented inverted shifted fraction portion based on the rounding data thereby to yield the received number in integer notation.

20 Claims, 6 Drawing Sheets

CONVERTING NEGATIVE FLOATING POINT NUMBERS TO INTEGER NOTATION WITHOUT TWO'S COMPLEMENT HARDWARE

CROSS-REFERENCES TO RELATED APPLICATIONS

This patent application is related to commonly assigned and contemporaneously filed U.S. patent applications Ser. No. 09/377,683. filed Aug. 19, 1999, entitled "ROUNDING DENORMALIZED NUMBERS IN A PIPELINED FLOATING POINT UNIT WITHOUT PIPELINE STALLS"; Ser. No. 09/377,140, filed Aug. 19, 1999, entitled "FORMATTING DENORMAL NUMBERS FOR PROCESSING IN A PIPELINED FLOATING POINT UNIT"; Ser. No. 09/377, 136, filed Aug. 19, 1999, entitled "INTEGER TO FLOATING POINT CONVERSION USING ONE'S COMPLEMENT WITH SUBSEQUENT CORRECTION TO ELIMINATE TWO'S COMPLEMENT IN CRITICAL PATH"; and Ser. No. 09/377,139, filed Aug. 19, 1999, entitled "LEADING BIT PREDICTION WITH IN-PARALLEL CORRECTION", all of which are herein incorporated by reference.

TECHNICAL FIELD OF THE INVENTION

The present invention is directed, in general, to microprocessors and, more particularly, to a processor architecture employing an improved floating point unit (FPU) and a computer system employing the processor.

BACKGROUND OF THE INVENTION

The ever-growing requirement for high performance computers demands that computer hardware architectures maximize software performance. Conventional computer architectures are made up of three primary components: (1) a processor, (2) a system memory and (3) one or more input/output devices. The processor controls the system memory and the input/output ("I/O") devices. The system memory stores not only data, but also instructions that the processor is capable of retrieving and executing to cause the computer to perform one or more desired processes or functions. The I/O devices are operative to interact with a user through a graphical user interface ("GUI") (such as provided by Microsoft Windows™ or IBM OS/2™), a network portal device, a printer, a mouse or other conventional device for facilitating interaction between the user and the computer.

Over the years, the quest for ever-increasing processing speeds has followed different directions. One approach to improve computer performance is to increase the rate of the clock that drives the processor. As the clock rate increases, however, the processor's power consumption and temperature also increase. Increased power consumption is expensive and high circuit temperatures may damage the processor. Further, the processor clock rate may not increase beyond a threshold physical speed at which signals may traverse the processor. Simply stated, there is a practical maximum to the clock rate that is acceptable to conventional processors.

An alternate approach to improve computer performance is to increase the number of instructions executed per clock cycle by the processor ("processor throughput"). One technique for increasing processor throughput is pipelining, which calls for the processor to be divided into separate processing stages (collectively termed a "pipeline"). Instructions are processed in an "assembly line" fashion in the processing stages. Each processing stage is optimized to perform a particular processing function, thereby causing the processor as a whole to become faster.

"Superpipelining" extends the pipelining concept further by allowing the simultaneous processing of multiple instructions in the pipeline. Consider, as an example, a processor in which each instruction executes in six stages, each stage requiring a single clock cycle to perform its function. Six separate instructions can therefore be processed concurrently in the pipeline; i.e., the processing of one instruction is completed during each clock cycle. The instruction throughput of an n-stage pipelined architecture is therefore, in theory, n times greater than the throughput of a non-pipelined architecture capable of completing only one instruction every n clock cycles.

Another technique for increasing overall processor speed is "superscalar" processing. Superscalar processing calls for multiple instructions to be processed per clock cycle. Assuming that instructions are independent of one another (the execution of each instruction does not depend upon the execution of any other instruction), processor throughput is increased in proportion to the number of instructions processed per clock cycle ("degree of scalability"). If, for example, a particular processor architecture is superscalar to degree three (i.e., three instructions are processed during each clock cycle), the instruction throughput of the processor is theoretically tripled.

These techniques are not mutually exclusive; processors may be both superpipelined and superscalar. However, operation of such processors in practice is often far from ideal, as instructions tend to depend upon one another and are also often not executed efficiently within the pipeline stages. In actual operation, instructions often require varying amounts of processor resources, creating interruptions ("bubbles" or "stalls") in the flow of instructions through the pipeline. Consequently, while superpipelining and superscalar techniques do increase throughput, the actual throughput of the processor ultimately depends upon the particular instructions processed during a given period of time and the particular implementation of the processor's architecture.

The speed at which a processor can perform a desired task is also a function of the number of instructions required to code the task. A processor may require one or many clock cycles to execute a particular instruction. Thus, in order to enhance the speed at which a processor can perform a desired task, both the number of instructions used to code the task as well as the number of clock cycles required to execute each instruction should be minimized.

Statistically, certain instructions are executed more frequently than others. If the design of a processor is optimized to rapidly process the instructions which occur most frequently, then the overall throughput of the processor can be increased. Unfortunately, the optimization of a processor for certain frequent instructions is usually obtained only at the expense of other less frequent instructions, or requires additional circuitry, which increases the size of the processor.

As computer programs have become more graphic-oriented, processors have had to deal increasingly with the conversion between floating point and integer representations of numbers. Thus, to enhance the throughput of a processor that must generate data necessary to represent graphical images, it is desirable to optimize the processor to efficiently convert floating point data to integer data.

Therefore, what is needed in the art is an efficient system and method for converting numbers from floating point notation to integer notation and a computer system employing the same. Preferably, the optimization of the processor should not require any additional hardware or degrade the performance of the processor in performing tasks other than floating point to integer conversions.

SUMMARY OF THE INVENTION

To address the above-discussed deficiencies of the prior art, it is a primary object of the present invention to provide an efficient system and method for converting numbers from floating point notation to integer notation and a computer system employing the system or the method.

In the attainment of the above primary object, the present invention provides, for use in a processor having integer and floating point execution cores, logic circuitry for, and a method of, converting negative numbers from floating point notation to integer notation. In one embodiment, the logic circuitry includes: (1) a shifter that receives a number in floating point notation and shifts a fraction portion of the received number as a function of an exponent portion thereof to yield a shifted fraction portion and rounding data, (2) a one's complementer, coupled to the shifter, that inverts the shifted fraction portion to yield an unincremented inverted shifted fraction portion, (3) an incrementer, coupled to the one's complementer, that increments the unincremented inverted shifted fraction portion to yield an incremented inverted shifted fraction portion and (4) a multiplexer, coupled to the one's complementer and the incrementer, that selects one of the unincremented inverted shifted fraction portion and the incremented inverted shifted fraction portion based on the rounding data thereby to yield the received number in integer notation.

The present invention therefore fundamentally reorders the process by which numbers are converted from floating point to integer notation to allow such numbers to be converted faster (typically expressed in terms of clock cycles) and, in some embodiments, as a pipelined process. The present invention is founded upon the novel realization that the two's complement of a rounded-up, negative floating point number is equivalent to the one's complement of the number.

In one embodiment of the present invention, the logic circuitry further includes a second multiplexer, interposed between the one's complementer and the incrementer, that selects one of the shifted fraction portion and the inverted shifted fraction portion based on a sign of the received number. Thus, the present invention can be adapted for use in additionally converting positive numbers. Positive numbers have no need to be two's complemented during conversion. Therefore, in this embodiment, steps are taken to bypass the one's complementing and incrementing to which negative numbers are subjected.

In one embodiment of the present invention, the logic circuitry further includes rounding logic, coupled to the shifter, that receives the rounding data and derives therefrom a rounding indicator (which may be a binary value). The multiplexer selects the one of the unincremented inverted shifted fraction portion and the incremented inverted shifted fraction portion based on the rounding indicator. In an embodiment to be illustrated and described, the present invention makes use of existing rounding logic to determine when rounding should or should not take place. In the embodiment, much of the conversion process takes place while the rounding logic derives the rounding indicator.

In one embodiment of the present invention, the logic circuitry further includes an exclusive OR gate that receives the rounding indicator and a sign of the number and causes the multiplexer to select the incremented inverted shifted fraction portion when the rounding indicator and the sign are at different logic levels. In this embodiment, the incremented inverted shifted fraction portion is properly selectable only when the rounding indicator and the sign are at different logic levels (incrementing should occur if the number is positive and requires upward rounding or if the number is negative and does not require upward rounding).

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
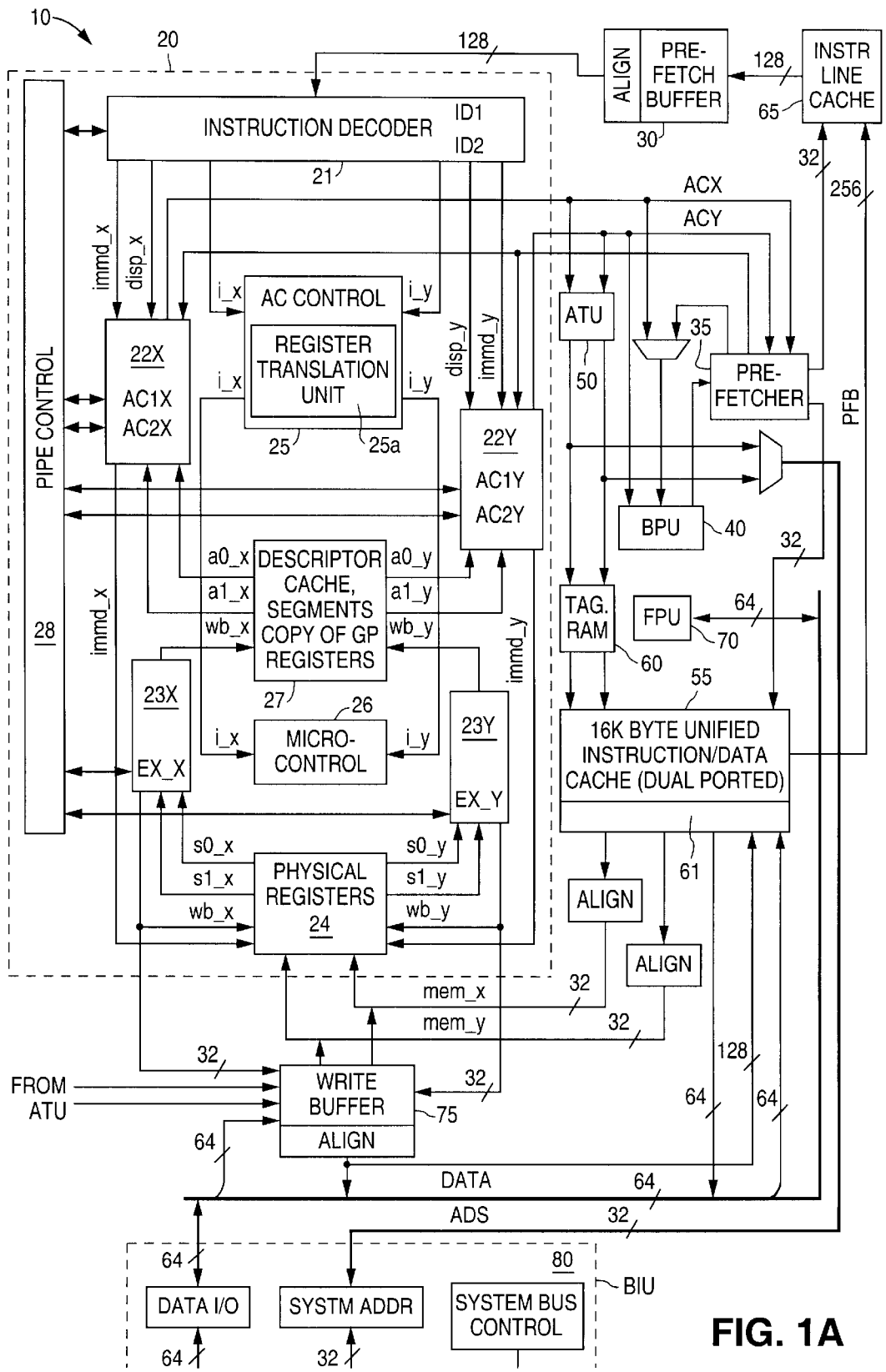
FIG. 1a illustrates a block diagram of an exemplary superscalar and superpipelined processor in accordance with the principles of the present invention.

Referring initially to FIG. 1a, illustrated is a block diagram of an exemplary superscalar and superpipelined processor 10 in accordance with the principles of the present invention. Exemplary processor 10 includes a processor core 20, a prefetch buffer 30, a prefetcher 35, a branch processing unit ("BPU") 40, an address translation unit ("ATU") 50, a unified cache 55, TAG random access memory ("TAG RAM") 60, an instruction line cache 65, an onboard floating point unit ("FPU") 70, a plurality of write buffers 75 (one shown), and a bus interface unit ("BIU") 80. Each of the above-identified components is conventional, i.e., their functionality is known. The functionality associated with the interrelationship of various ones of the components is also known. Exemplary processors implementing the foregoing are the 6×86 and MII processors available from Cyrix Corporation of Richardson, Tex.

In an exemplary embodiment, instruction line cache 65 and unified cache 55 operate as primary and secondary instruction caches, respectively, each having a 32 byte line size. This implementation reduces instruction fetches to unified cache 55. In a preferred embodiment, instruction line cache 65 may be a 256 byte cache, while unified cache 55 maybe a 16 kilobyte ("Kbyte") code/data cache. Unified cache 55 may also be associated with TAG RAM 60. In another exemplary embodiment, processor 10 may use a 32-bit address bus ("ADS"), a 64-bit data bus ("DATA") and a 256 bit pre-fetch bus ("PFB"). The PFB corresponds to the 32 byte line sizes of unified cache 55 and instruction line cache 65, and enables a full line of 32 instruction bytes to be transferred to instruction line cache 65 in a single clock cycle.

Unified cache 55 is preferably 4-way set associative, using a pseudo-least-recently-used ("LRU") replacement algorithm, with selectively alternative write-through and write-back modes. Unified cache 55 is multi-ported (through banking) to permit two memory accesses (e.g., data reads, instruction fetches or data writes) per clock cycle. Instruction line cache 65 is preferably a fully associative, look-aside implementation (relative to the unified cache 55), using an LRU replacement algorithm.

Turning momentarily to exemplary processor core 20, illustrated is a superscalar and superpipelined design having two exemplary execution pipelines, designated X and Y, and including an instruction decode ("ID") stage 21, two address calculation/operand access ("AC") stages, 22X and 22Y, two execution ("EX") stages, 23X and 23Y, and a register file 24 having 31 32-bit registers. Core 20 further includes an AC control stage 25, a microcontrol unit 26, a pipe control unit 28, and a second register file 27 containing a descriptor cache, segment registers and a copy of the logical general purpose registers.

Exemplary ID stage 21 is operative to decode a variable length x86-based instruction set, and may retrieve 16 bytes of instruction data from pre-fetch buffer 30 each clock cycle. Exemplary AC stages 22X and 22Y are each operative to perform address calculations for their respective execution pipelines. Exemplary EX stages 23X and 23Y are each operative to execute instructions within their respective execution pipelines. Exemplary register file 24 includes 31 physical registers. Exemplary AC control stage 25, which includes a register translation unit 25a, and may further include appropriately arranged register renaming hardware (not shown), is operative to control address calculations. Exemplary microcontrol unit 26, which may include a micro-sequencer (not shown) and a micro-ROM (not shown), provides execution control. Again, exemplary second register file 27 may include a descriptor cache, segment registers and a copy of the logical general purpose registers (i.e., as obtained from register file 24). Exemplary pipe control unit 28 is operative to control instruction flow through exemplary execution pipelines X and Y, whereby instruction order is maintained until pipe control unit 28 determines that a particular instruction will not cause an exception.

In an exemplary embodiment, register translation unit 25a has a capacity to map 32 physical registers to 8 logical registers. In the illustrated embodiment however, processor 10 includes only 31 physical registers, leaving register translation unit 25a with excess mapping capacity. Processor 10 may use the excess mapping capacity by allowing register translation unit 25a to map to a physical register other than those located in register file 24. In the illustrated embodiment, the physical register may be located in second register file 27, which is under control of AC control unit 25. In an alternate exemplary embodiment, pipe control unit 28 is further operative to remove bubbles from the instruction stream, i.e., "flushing" the execution pipelines behind branches that are mis-predicted and handling the execution of exception-causing instructions.

More particularly, BPU 40 monitors speculative execution associated with branches or floating point instructions (i.e., execution of instructions speculatively issued after branches that may be mis-predicted or floating point instructions issued to FPU 70 that may fault after execution of speculatively-issued instructions). In the event that a branch is mis-predicted (a condition not known until the instruction reaches one of the execution or write-back stages for the branch) or a floating point instruction faults, the execution pipeline is repaired to the point of the mis-predicted or faulting instruction (i.e., the execution pipeline is "flushed" behind the instruction) and an associated instruction fetch is restarted. Pipeline repair is preferably accomplished by creating processor state checkpoints at each pipeline stage as a predicted branch or floating point instruction enters the same. For these check pointed instructions, all processor resources (e.g., programmer-visible registers, the instruction pointer and the condition code register) that may be modified by succeeding speculatively-issued instructions are check pointed. If a check pointed branch is mis-predicted or a check pointed floating point instruction faults, the execution pipeline is flushed behind the check pointed instruction. In the case of floating point instructions, this typically results in the entire execution pipeline being flushed. However, for a mis-predicted branch, there may be a paired instruction in EX and two instructions in WB that are nonetheless allowed to complete.

In accordance with the illustrated embodiment, writes from processor core 20 may be queued into write buffer 75. Write buffer 75 provides an interface for writes to unified cache 55, while non-cacheable writes proceed directly from write buffer 75 to an external memory (shown and described in conjunction with FIG. 2). Write buffer logic may support optional read sourcing and write gathering. In an exemplary embodiment, write buffer 75 includes twelve 32-bit write buffers, and write buffer allocation is performed by AC control unit 25.

FPU 70 includes a load/store stage with 4-deep load and store queues, a conversion stage (32-bit to 80-bit extended format), and an execution stage. Loads are controlled by processor core 20, and cacheable stores are directed through write buffer 75 (i.e., write buffer 75 is preferably allocated for each floating point store operation).

Figure 1B:
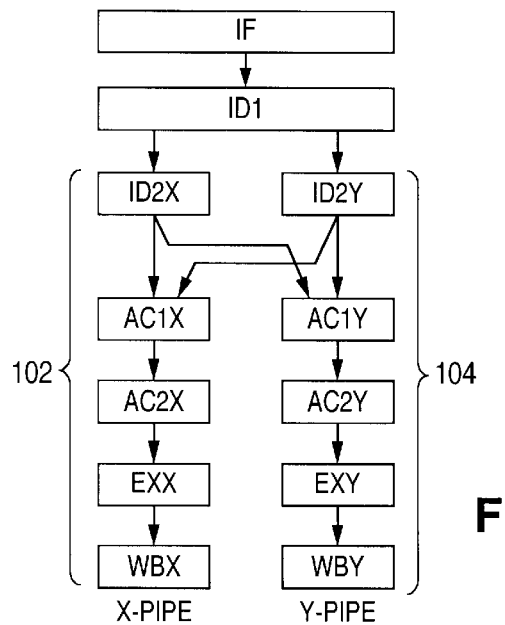
FIG. 1b illustrates a block diagram of seven exemplary pipelined stages of the processor of FIG. 1a, including X and Y execution pipelines.

Turning to FIG. 1b, illustrated is a block diagram of seven exemplary pipelined stages of processor 10 of FIG. 1a, including X and Y execution pipelines. As before, each of the X and Y execution pipelines includes IF, ID1, ID2, AC1, AC2, EX and WB stages. Exemplary IF stage provides a continuous instruction code stream into processor core 20. Prefetcher 35 is operative to fetch 16 bytes of instruction data into prefetch buffer 30 from either instruction line cache 65 or unified cache 55. BPU 40 is accessed with the prefetch address, and supplies target addresses to prefetcher 35 for predicted changes of flow, allowing prefetcher 35 to shift to a new code stream in a single clock cycle.

Exemplary decode stages ID1 and ID2 decode a variable length x86-based instruction set. Instruction decoder 21 retrieves 16 bytes of instruction data from prefetch buffer 30 each clock cycle. In ID1, the length of two instructions is decoded (one each for the X and Y execution pipelines) to obtain X and Y instruction pointers, a corresponding X and Y bytes-used signal is returned to prefetch buffer 30 which subsequently increments for the next 16 byte transfer. Also in ID1, certain instruction types are determined, such as changes of flow, and immediate or displacement operands are separated. In ID2, the decoding of X and Y instructions is completed, generating entry points for "microROM" and decoding addressing modes and register fields.

The optimum pipeline, X or Y, for executing an instruction is determined during the ID stages, causing the instruction to be issued into that pipeline. In an exemplary embodiment, circuitry is provided for pipeline switching which enables instructions to be switched from ID2X to AC1Y and from ID2Y to AC1X, as certain instructions (e.g., change of flow, floating point, exclusive or other like instructions) may only be issued in one of the two pipelines.

"Exclusive instructions" as the phrase is used herein, include any instructions that may fault within the EX pipeline stage, as well as certain instruction types, such as protected mode segment loads, string, special register access (control, debug, test, etc.), Multiply/Divide, Input/Output, PUSHA/POPA (PUSH all/POP all), task switch and the like. Exclusive instructions may use the resources of both execution pipelines; exclusive instructions are preferably issued alone from the ID stage.

Exemplary address calculation stages AC1 and AC2 calculate addresses for memory references and supply memory operands. During AC1 two 32 bit linear (three operand) addresses are preferably calculated per clock cycle. Data dependencies are checked and resolved using register translation unit 25a and the 31 physical registers in register file 24 are advantageously used to map eight general purpose, programmer-visible logical registers in accordance with x86-based architecture, namely: EAX, 20 EBX, ECX, EDX, EDI, ESI, EBP and ESP. During AC2, register file 24 and unified cache 55 are accessed with the physical address. For cache hits, cache access time for multi-ported, unified cache 55 is the same as that of a register, effectively extending the register set. The physical address is either the linear address, or if address translation is enabled, a translated address generated by ATU 50.

The AC stage preferably includes eight logical, or architectural, registers, representing the x86-based register set. In a preferred embodiment, the logical register corresponding to the stackpointer ("ESP") contains the actual stackpointer (instead of simply a copy thereof) when control of the stackpointer is allocated to AC1. If an instruction requires one or more address calculations, AC1 is operative to wait until the required data of the logical registers are valid before accessing those registers. During AC2, operands are obtained by accessing register file 24 and unified cache 55 with the physical address. The physical address therefore is preferably either the linear address or, if address translation is enabled, a translated address generated by ATU 50.

Exemplary ATU 50 is operative to generate translated addresses, preferably using a translation lookaside buffer ("TLB") or the like, from the linear address using information from page tables in memory and local workspace control registers. Unified cache 55 is virtually indexed and physically tagged to permit, when address translation is enabled, set selection with the untranslated address (available at the end of AC1) and, for each set, tag comparison with the translated address from ATU 50 (available early in AC2). In the illustrated embodiment, segmentation or address translation violation checks are performed in AC2.

Instructions within a given instruction code stream are preferably kept in order until it is determined that out-of-order execution of the same will not cause an exception. This determination may be made during or before AC2, although floating point and certain exclusive instructions may cause exceptions during execution. Instructions are passed from AC2 to EX (floating point instructions are passed to FPU 70). Instructions spend a variable number of clock cycles in EX as many of the same may execute out of order. Integer instructions may cause exceptions in EX and are therefore designated as exclusive and issued alone into both execution pipelines, thereby ensuring that exceptions are handled in order.

Exemplary execution stages EX X and EX Y perform the operations defined by a given instruction using one or more adders, multiplexers, shifters, or other functional units. The EX X execution stage may also include multiplication and division hardware.

Exemplary write back stage ("WB") updates register file 24, condition codes, as well as other parts of an associated processing system with the results of the previously executed instruction. Typically, register file 24 is written in phase 1 ("PH1") of WB and read in phase 2 ("PH2") of AC2.

Additional disclosure of write buffers 75, speculative execution and the microsequencer may be found in U.S. Pat. No. 5,584,009 entitled "System And Method Of Retiring Store Data From A Write Buffer"; U.S. Pat. No. 5,835,967 entitled "Adjusting Prefetch Size Based On Source Of Prefetch Address"; and U.S. Pat. No. 5,644,741 entitled "Processor With Single Clock Decode Architecture Employing Single MicroROM", all of which are commonly assigned to the Assignee of the present invention and are herein incorporated by reference.

Figure 2:
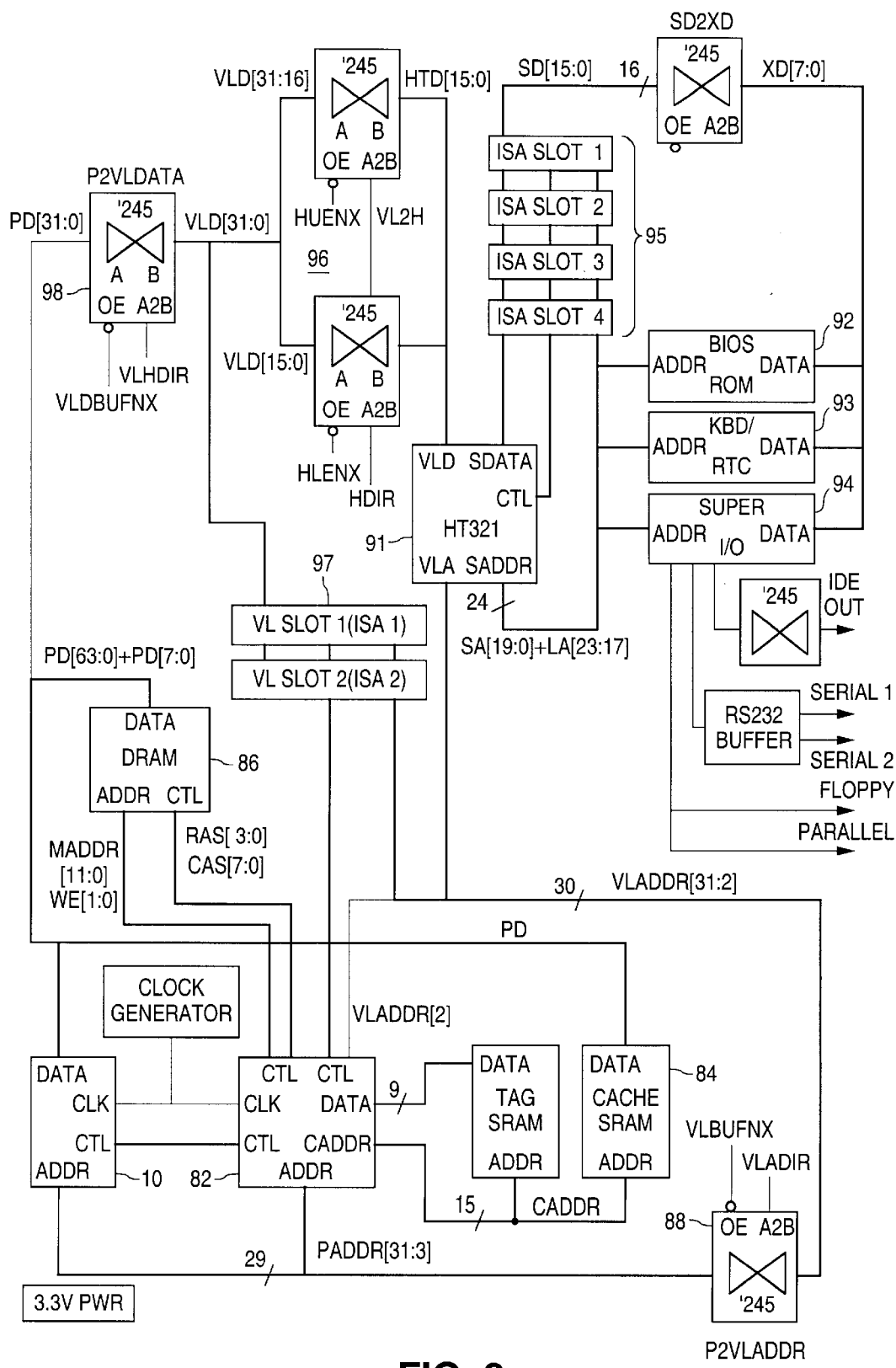
FIG. 2 illustrates a block diagram of an exemplary processor system incorporating the processor of FIGS. 1a and 1b.

Turning to FIG. 2, illustrated is an exemplary processor system design, in the form of a motherboard, that advantageously employs exemplary processor 10 of FIGS. 1a and 1b in cooperation with a single chip memory/bus controller 82. Controller 82 provides an interface between processor 10 and an external memory subsystem controlling data movement over the 64-bit processor data bus. The external memory subsystem includes level two cache 84 and main memory 86. In accordance with the illustrated embodiment, the data path may be external to controller 82 thereby reducing its pin count and cost.

Controller 82 preferably interfaces with ADS, the 32-bit address bus, directly and includes a one bit wide data port (not shown) for reading and writing registers within controller 82. A bidirectional isolation buffer 88 is preferably provided as an address interface between processor 10 and a conventional video local bus ("VL-Bus") and a conventional industry standard architecture ("ISA") bus. Controller 82 provides control for VL-Bus and ISA bus interfaces. A VL/ISA interface chip 91 provides standard interfaces to an exemplary 32-bit VL-Bus and an exemplary 16-bit ISA bus. The ISA bus may interface to a basic input/output system ("BIOS") 92, a keyboard controller 93, and an I/O chip 94, as well as standard ISA slots 95. The interface chip 91 preferably interfaces to the 32-bit VL-bus through a bidirectional 32/16 multiplexer 96 formed by multiple high/low word isolation buffers. The VL-Bus interfaces to standard VL-Bus slots 97 and, through a bidirectional isolation buffer 98, to the low double word of PD.

Figure 3:
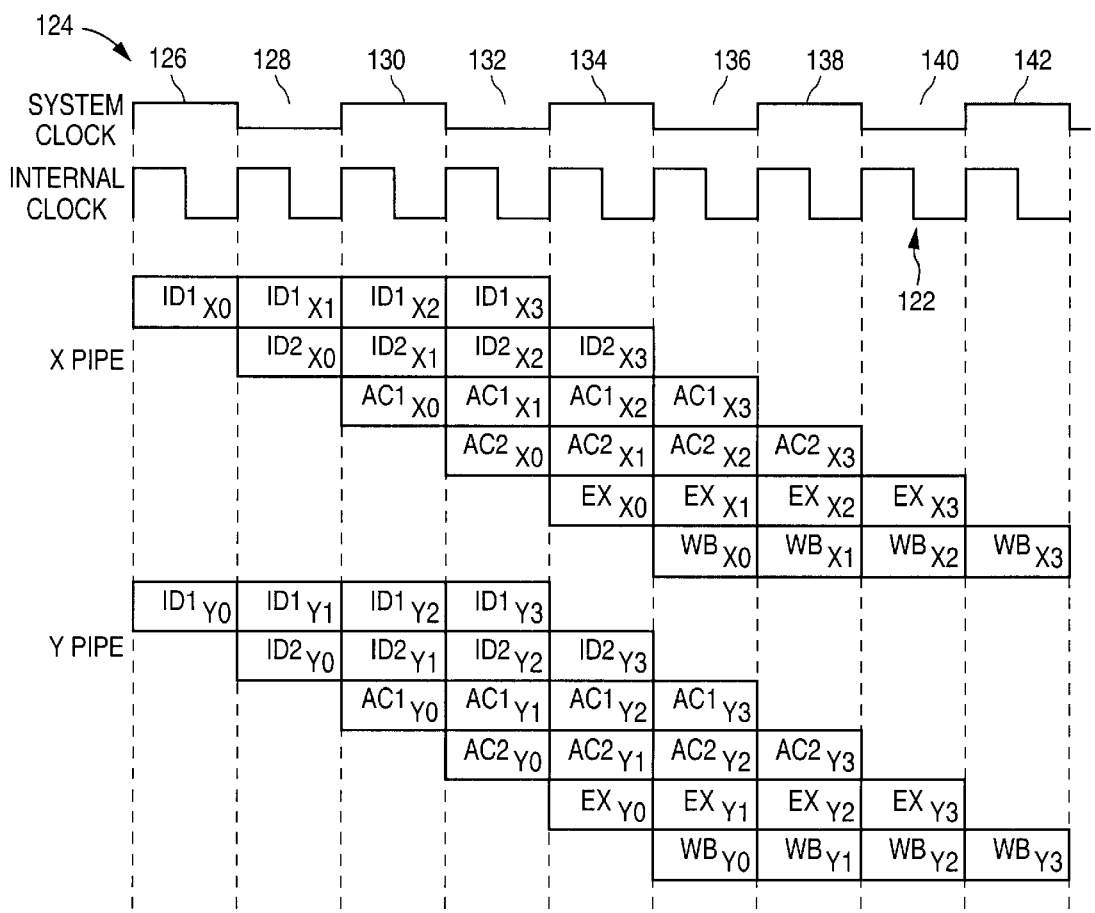
FIG. 3 illustrates an exemplary timing diagram demonstrating the flow of instructions through a pipeline in accordance with the exemplary processor of FIGS. 1a through 2.

Turning to FIG. 3, illustrated is an exemplary timing diagram demonstrating the flow of instructions through a pipeline of processor 10 of FIGS. 1a and 2. The timing diagram illustrates the flow of eight instructions through the pipeline, showing overlapping execution of instructions for a two pipeline architecture. Processor 10 preferably uses an internal clock 122 that is a multiple of a system clock 124. In the illustrated embodiment, internal clock 122 operates at twice the frequency of system clock 124.

During a first internal clock cycle 126, the ID1 stage operates respectively on instructions X0 and Y0. During internal clock cycle 128, instructions X0 and Y0 are in the ID2 stage (X0 being in ID2X and Y0 being in ID2Y) and instructions X1 and Y1 are in the ID1 stage. During internal clock cycle 130, instructions X2 and Y2 are in the ID1 stage, instructions X1 and Y1 are in the ID2 stage (X1 being in ID2X and Y1 being in ID2Y) and instructions X0 and Y0 are in the AC1 stage (X0 being in AC1X and Y0 being in AC1Y). During internal clock cycle 132, instructions X3 and Y3 are in the ID1 stage, instructions X2 and Y2 are in the ID2 stage, instructions X1 and Y1 are in the AC1 stage and instructions X0 and Y0 are in the AC2 stage.

The execution portion of each of the foregoing instructions is performed during sequential clock cycles, namely, clock cycles 134 to 140. This is an important aspect a pipelined architecture as the total instructions completed per clock cycle increases without reducing the execution time of individual instructions. Greater instruction throughput is thereby achieved without requiring greater demands on the speed of the hardware.

It should be noted that FIG. 3 illustrates an optimum condition, as no stage requires more than a single clock cycle. In actuality, however, one or more stages may require additional clock cycles for completion, thereby changing instruction flow through the other pipeline stages. Further, instruction flow through one pipeline may depend upon the flow of other instructions in the same or the other pipeline.

Figure 4:
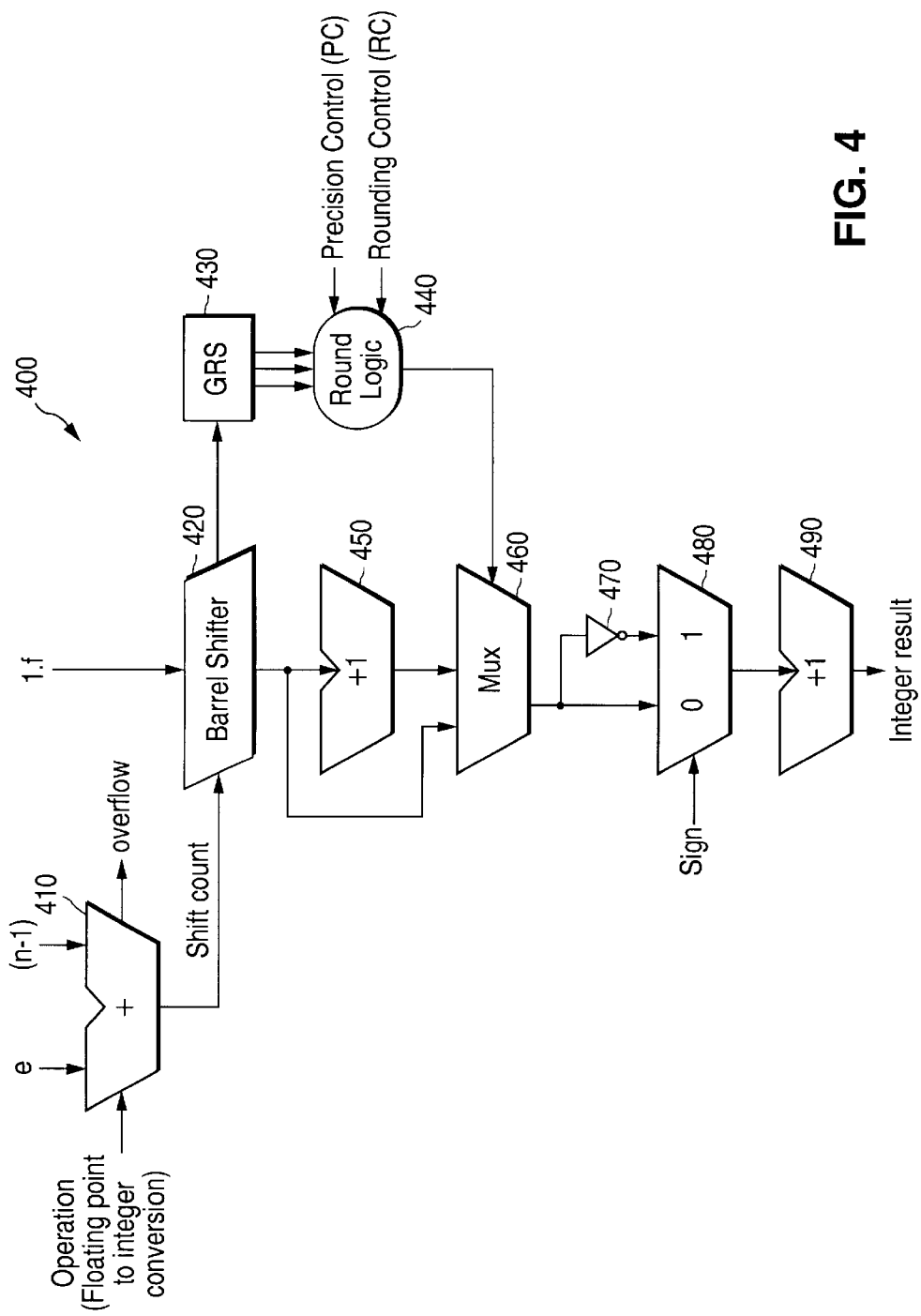
FIG. 4 illustrates a block diagram of a conventional circuit for performing floating point to integer conversions.

The focus of the present invention is directed to optimizing the operation of FPU 70 in the conversion of numbers from floating point to integer notation. Various apparatuses and methods related to the conversion of numbers from floating point to integer notation have been proposed, including those disclosed in U.S. Pat. No. 5,161,117, issued Nov. 3, 1992 to Waggener; U.S. Pat. No. 5,257,215, issued Oct. 26, 1993, to Poon; U.S. Pat. No. 5,272,654, issued Dec. 21, 1993, to Nix; U.S. Pat. No. 5,561,615, issued Oct. 1, 1996 to Kuo, et al.; U.S. Pat. No. 5,619,198, issued Apr. 8, 1997, to Blackham, et al.; and U.S. Pat. No. 5,652,584, issued Jul. 29, 1997, to Yoon, all of which are incorporated herein by reference. Referring to FIG. 4, illustrated is a block diagram of a conventional circuit 400 for performing floating point to integer conversions. A description of the operation of circuit 400 may be used to understand the problem addressed and solved by the present invention. The representation of an integer in floating point notation is $1.f \times 2^e$, where "f" is the fraction portion of the number and "e" is the exponent. A single precision representation requires 23 bits for f and 8 bits for e; a double precision representation requires 52 bits for f and 11 bits for e; and an extended precision representation requires 64 bits for f and 15 bits for e. If the integer is represented by "I" and I has n bits, those skilled in the art will recognize that $-(2^{n-1}) \leq I \leq (2^{n-1}-1)$; this is illustrated in TABLE 1 for a four bit integer (i.e., n=4).

TABLE 1

| | Sign Bit | Bit Values | | | |
|---|---|---|---|---|---|
| | | $2^2$ | $2^1$ | $2^0$ | |
| 4 bit integer: | x | x | x | x | n = 4 |
| Maximum positive number = | 0 | 1 | 1 | 1 | |
| Integer value = | | | 7 | | $(2^{(4-1)} - 1) = 7$ |
| Maximum negative number = | 1 | 0 | 0 | 0 | |
| Two's complement = | (−)1 | 0 | 0 | 0 | |
| Integer value = | | −8 | | | $-2^{(4-1)} = -8$ |

Those skilled in the art will also recognize that the value of the exponent V(e) is constrained by the relationship $0 \leq V(e) \leq 2^x - 1$, where "x" is the number of bits available to represent e.

First, if V(e)>(n−1) and the number is positive, or if V(e)>n and the number is negative, those skilled in the art will recognize that integer overflow will occur;, i.e., the floating point number is too large to be represented in integer format. Second, if V(e)<(n−1) and the number is positive, then the conversion from floating point notation to integer form requires four operations: (1) the calculation n−V(e)=m, which can be accomplished with an adder 410, where "m" is the value of a "shift count"; (2) the shifting of 1.f right by m, which can be accomplished using a barrel shifter 420; (3) the generation of guard/round/sticky ("GRS") bit information, which those skilled in the art are familiar with, can be accomplished using conventional GRS logic circuitry 430; and (4) the rounding up of the output of the barrel shifter 420, if required, under the control of conventional rounding logic 440 in combination with an incrementer 450 and multiplexer 460.

If V(e)<(n−1) and the number is negative, however, a two's complement operation on the rounded output of the barrel shifter (i.e., the output of multiplexer 460) must be performed in addition to the four basic operations required for floating point to integer conversions. Two's complementing of a binary number requires negating the number and adding "1" to the least significant bit ("LSB"); those skilled in the art will recognize that the two's complement of a binary number can be obtained through the use of an inverter 470, a multiplexer 480, and an incrementer 490.

Lastly, if V(e)=n and the number is positive, those skilled in the art will recognize that the number is already in integer form and can thus be passed directly through the conventional circuit 400, and if V(e)=n and the number is negative, only the two's complement is required to yield the number in integer form.

From the foregoing, it can be appreciated that for negative numbers there is an additional operation required to perform a conversion from floating point to integer notation, which results in asymmetrical pipelines for the conversion of negative and positive numbers, and results in a penalty for positive floating point to integer conversions because of the extra operation required for negative floating point to integer conversions. The present invention, however, takes advantage of the novel insight that the two's complement of a rounded-up negative number in floating point notation is equivalent to the one's complement of the binary number, i.e., the inversion of the number. As illustrated hereinafter, a floating point to integer conversion circuit employing this novel realization can significantly speed up the performance of floating point to integer conversions and can result in very organized pipelined operations with reduced hardware requirements.

To prove the novel concept introduced by the present invention, let "A" represent the n-bit magnitude portion of a signed (N+1) bit integer in signed magnitude form, where the (N+1)th bit, i.e., the most significant bit ("MSB"), is the sign bit. Those skilled in the art will recognize that the two's complement of the rounded-up value of A is equal to $2^N-(A+1)$, which can be rewritten as $(2^N-1)-A$, which is just the one's complement of A. For example, let A be the 5-bit magnitude of a 6-bit signed magnitude number equal to 1,00101; i.e., A is equal to 00101, or 5, and the rounded-up value of A is equal to A+1, which is equal to 00110, or 6. The two's complement of (A+1) is equal to the two's complement of 00110, which is 11010, or 26; similarly the two's complement is equal to $2^N-(A+1)$, or $2^5-6$, which equals 26. The one's complement of A (00101) is equal to 11010, or 26; similarly, the one's complement is equal to $(2^N-1)-A$, or $(2^5-1)-5$, which also equals 26. The novel observation that the two's complement of a rounded-up negative floating point number is equivalent to the one's complement of the number is not merely academic, but, as illustrated hereinafter, can be employed in an efficient system and method for converting numbers from floating point notation to integer notation. The system and method does not require any additional hardware over conventional conversion circuits, nor does it degrade the performance of a processor in performing tasks other than floating point to integer conversions.

Figure 5:
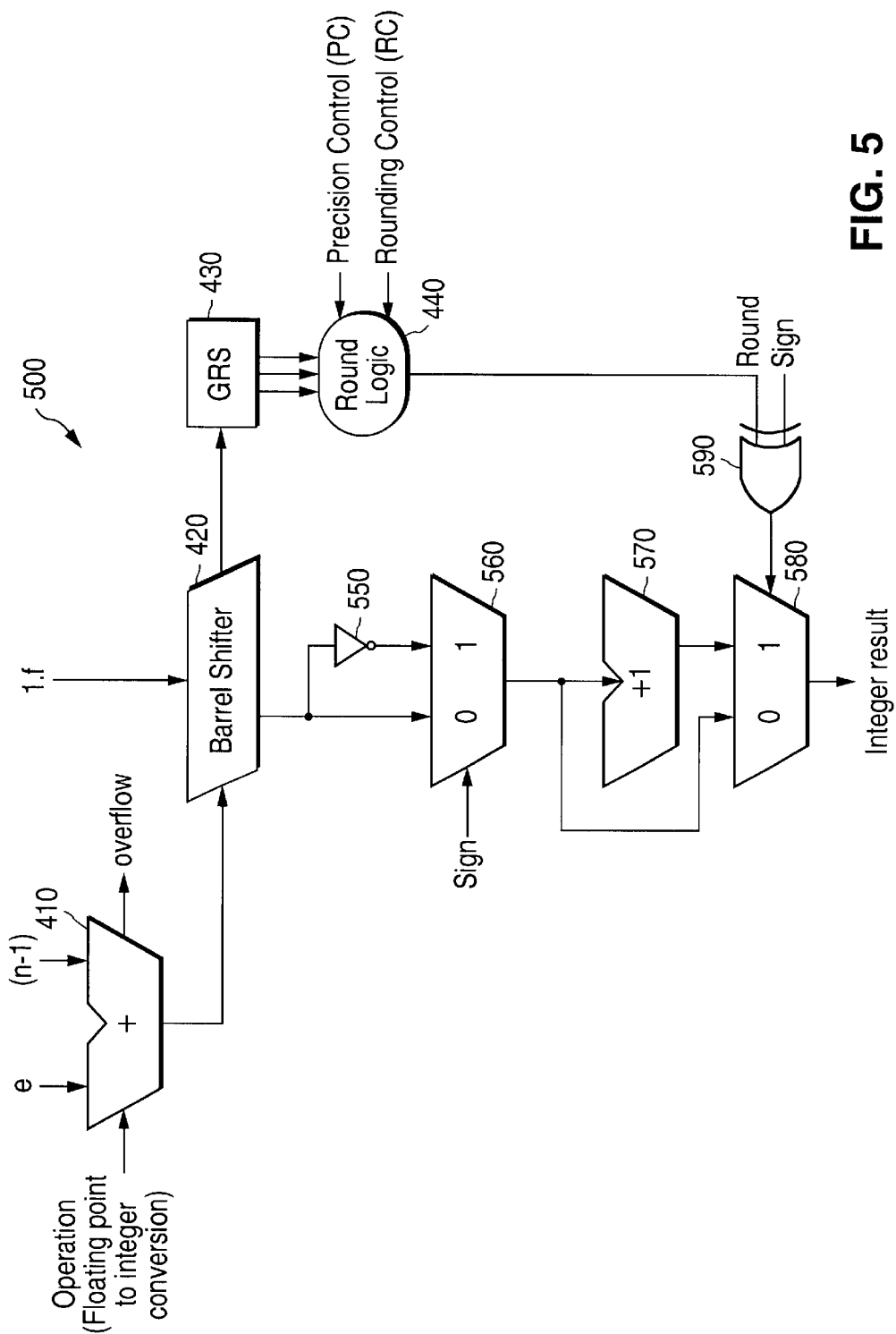
FIG. 5 illustrates an exemplary embodiment of circuitry for performing floating point to integer conversions, according to the principles of the present invention, which overcomes the disadvantages of conventional floating point to integer conversion circuits and methods.

Turning now to FIG. 5, illustrated is an exemplary embodiment of a floating point to integer conversion circuit 500, according to the principles of the present invention, which overcomes the disadvantages of conventional floating point to integer conversion circuits and methods. The architecture and operation of circuit 510 is identical to the conventional circuit 400 with respect to adder 410, barrel shifter 420, GRS logic circuitry 430, and rounding logic 440; in addition conversion circuit 500 includes an inverter 550, a multiplexer 560, an incrementer 570, a multiplexer 580, and an exclusive "OR" gate 590.

The output, or "integer result" of the circuit 500 is a function of the sign of the number, in floating point notation, received by the circuit 500 and the logical output of the rounding logic 440. As summarized in TABLE 2, below, if the received number is positive (sign=0) and the output of the rounding logic 440 is "0" then the integer result is simply the number at the output of the barrel shifter 420; if the received number is positive (sign=0) and the output of the rounding logic 440 is "1", then the integer result is the number at the output of the barrel shifter 420 incremented by incrementer 570; if the received number is negative (sign=1) and the output of the rounding logic 440 is "1", then the integer result is the two's complement of the number at the output of the barrel shifter 420 (the two's complement of the output of barrel shifter 420 is performed by selecting with multiplexer 560 the output inverted by inverter 550, and then incremented by incrementer 570); if the received number is negative (sign=1) and the output of the rounding logic 440 is "1", then the integer result is just the number at the output of the barrel shifter 420 inverted by inverter 550, thereby avoiding the two's complement operation performed by the conventional conversion circuit 400. As noted hereinabove, employing a two's complement operation in the conversion of negative floating point numbers requires an additional step over the conversion of positive numbers, resulting in asymmetrical pipelines for negative and positive floating point to integer conversions, or penalizing the conversion process for positive numbers because of the extra step required for the conversion of negative floating point numbers. The present invention therefore overcomes the disadvantages associated with conventional floating point to integer conversion circuits such as conversion circuit 400.

TABLE 2

| SIGN | ROUND | INTEGER RESULT |
| --- | --- | --- |
| 0 | 0 | Number from barrel shifter |
| 0 | 1 | Incremented barrel shifter result |
| 1 | 0 | Two's complemented barrel shifter result |
| 1 | 1 | Negated barrel shifter result |

Figure 6:
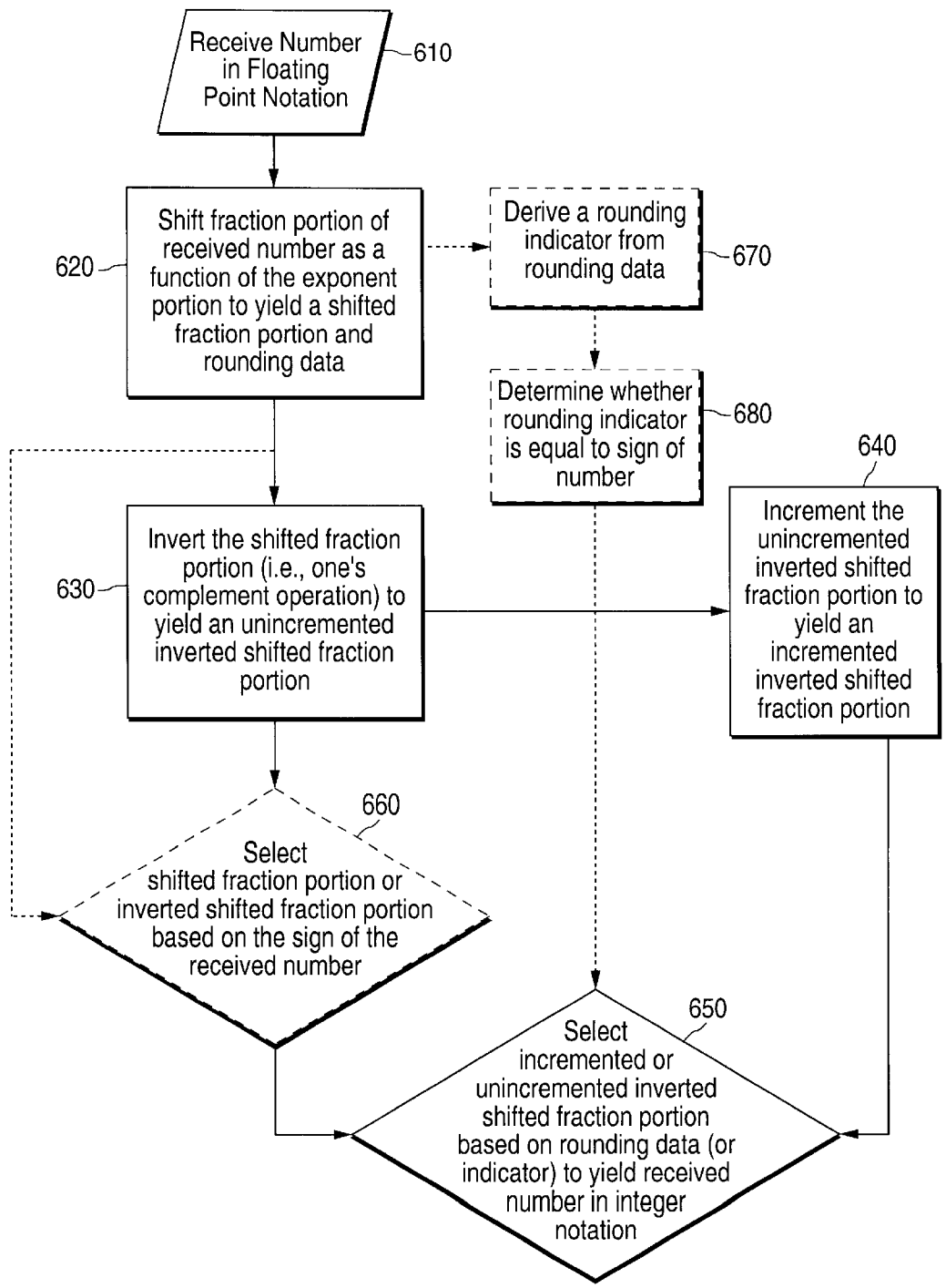
FIG. 6 illustrates a flow diagram of an exemplary embodiment of the method of the present invention.

Turning now to FIG. 6, illustrated is a flow diagram of an exemplary embodiment of the method of the present invention. In a first step 610, the number in floating point notation is received. In the exemplary conversion circuit 500, the exponent portion (e) of the number is received by the adder 410 and the fraction portion (e) is received by the barrel shifter 420; the adder 410, as a function of the value of the exponent portion, generates a "shift count" that is sent to barrel shifter 420. In a step 620, the fraction portion (f) of the received number is shifted as a function of the exponent portion (e), i.e., the shift count, to yield a "shifted fraction portion" and "rounding data".

In a step 630, the shifted fraction portion is inverted to yield an "unincremented inverted shifted fraction portion", which is performed by the inverter 550 in exemplary conversion circuit 500. The unincremented inverted shifted fraction portion is incremented to yield an "incremented inverted shifted fraction portion" in a step 640; the incrementing is performed by the incrementer 570 in exemplary conversion circuit 500. Finally, in a step 650, the incremented or unincremented inverted shifted fraction portion is selected based on the rounding indicator; the selection is performed by multiplexer 580 in the exemplary conversion circuit 580.

The foregoing steps—steps 610, 620, 630, 640 and 650—are sufficient for the conversion of negative numbers from floating point to integer notation. The exemplary conversion circuit 500, however, can perform floating point to integer conversions of positive numbers as well, by employing additional steps 660, 670 and 680. In step 660, the shifted fraction portion or inverted shifted fraction portion is selected based on the sign of the received number; the selection is performed by multiplexer 560 in the exemplary conversion circuit 580. In step 660, a rounding indicator is derived from the rounding data generated in step 620; in the exemplary conversion circuit 500, the rounding data is used in a conventional manner by GRS logic circuitry 430 and rounding logic 440 to generate a rounding bit, or "indicator". In a step 680, it is determined whether the rounding indicator is equal to the sign of the number; in the exemplary conversion circuit 500, an exclusive "OR" gate 590 is used to compare the rounding indicator to the sign of the number, the result of the comparison controlling the operation of multiplexer 580, which performs step 650.

Those skilled in the art will recognize from the foregoing descriptions with reference to FIGS. 4 and 5 that the present invention introduces a novel approach to the conversion of numbers from floating point to integer notation. Furthermore, those skilled in the art will recognize the applicability of the principles disclosed herein for providing such conversion in both conventional and pipelined microprocessor architectures. The advantages of the present invention over conventional architectures include a reduction in circuitry, a balanced algorithm for the conversion of both positive and negative floating point numbers, the capability of a pipelined conversion process, and faster operation due to the elimination of the two's complement operation associated with conventional conversion circuits.

From the above, it is apparent that the present invention provides an efficient system and method for converting numbers from floating point notation to integer notation and a computer system employing the same. A conventional processor may be optimized employing the system or method disclosed herein without requiring any significant additional hardware and without degradation of the performance of the processor in performing tasks other than floating point to integer conversions.

Although the present invention and its advantages have been described in detail, those skilled in the art should understand that they can make various changes, substitutions and alterations herein without departing from the spirit and scope of the invention in its broadest form.

What is claimed is:

1. For use in a processor having integer and floating point execution cores, logic circuitry for converting negative numbers from floating point notation to integer notation, comprising:
    a shifter that receives a number in floating point notation and shifts a fraction portion of the received number as a function of an exponent portion thereof to yield a shifted fraction portion and rounding data;
    a one's complementer, coupled to the shifter, that inverts the shifted fraction portion to yield an unincremented inverted shifted fraction portion;
    an incrementer, coupled to the one's complementer, that increments the unincremented inverted shifted fraction portion to yield an incremented inverted shifted fraction portion; and
    a multiplexer, coupled to the one's complementer and the incrementer, that selects one of the unincremented inverted shifted fraction portion and the incremented inverted shifted fraction portion based on the rounding data thereby to yield the received number in integer notation.

2. The logic circuitry as recited in claim 1 further comprising a second multiplexer, interposed between the one's complementer and the incrementer, that selects one of the shifted fraction portion and the inverted shifted fraction portion based on a sign of the received number.

3. The logic circuitry as recited in claim 1 further comprising rounding logic, coupled to the shifter, that receives the rounding data and derives therefrom a rounding indicator, the multiplexer selecting the one of the unincremented inverted shifted fraction portion and the incremented inverted shifted fraction portion based on the rounding indicator.

4. The logic circuitry as recited in claim 3 further comprising an exclusive OR gate that receives the rounding indicator and a sign of the number and causes the multiplexer to select the incremented inverted shifted fraction portion when the rounding indicator and the sign are at different logic levels.

5. For use in a processor having integer and floating point execution cores, logic circuitry for converting negative numbers from floating point notation to integer notation, comprising:
    shifting means for receiving a number in floating point notation and shifting a fraction portion of the received number as a function of an exponent portion thereof to yield a shifted fraction portion and rounding data;
    one's complementing means, coupled to the shifting means, for inverting the shifted fraction portion to yield an unincremented inverted shifted fraction portion;
    incrementing means, coupled to the one's complementing means, for incrementing the unincremented inverted shifted fraction portion to yield an incremented inverted shifted fraction portion; and
    multiplexing means, coupled to the one's complementing means and the incrementing means, for selecting one of the unincremented inverted shifted fraction portion and the incremented inverted shifted fraction portion based on the rounding data thereby to yield the received number in integer notation.

6. The logic circuitry as recited in claim 5 further comprising a second multiplexing means, interposed between the one's complementing means and the incrementing means, for selecting one of the shifted fraction portion and the inverted shifted fraction portion based on a sign of the received number.

7. The logic circuitry as recited in claim 5 further comprising rounding logic means, coupled to the shifting means, for receiving the rounding data and deriving therefrom a rounding indicator, the multiplexing means selecting the one of the unincremented inverted shifted fraction portion and the incremented inverted shifted fraction portion based on the rounding indicator.

8. The logic circuitry as recited in claim 7 further comprising an exclusive OR gating means for receiving the rounding indicator and a sign of the number and causing the multiplexing means to select the incremented inverted shifted fraction portion when the rounding indicator and the sign are at different logic levels.

9. For use in a processor having integer and floating point execution cores, a method of converting negative numbers from floating point notation to integer notation, comprising the steps of:
    (a) receiving a number in floating point notation;
    (b) shifting a fraction portion of the received number as a function of an exponent portion thereof to yield a shifted fraction portion and rounding data;
    (c) inverting the shifted fraction portion to yield an unincremented inverted shifted fraction portion;
    (d) incrementing the unincremented inverted shifted fraction portion to yield an incremented inverted shifted fraction portion; and
    (e) selecting one of the unincremented inverted shifted fraction portion and the incremented inverted shifted fraction portion based on the rounding data thereby to yield the received number in integer notation.

10. The method as recited in claim 9 further comprising the step of selecting one of the shifted fraction portion and the inverted shifted fraction portion based on a sign of the received number after performing the step (c).

11. The method as recited in claim 9 further comprising the step of deriving a rounding indicator from the rounding data, the step (e) comprising the step of selecting the one of the unincremented inverted shifted fraction portion and the incremented inverted shifted fraction portion based on the rounding indicator.

12. The method as recited in claim 11 further comprising the step of causing the multiplexer to select the incremented inverted shifted fraction portion when the rounding indicator and a sign of the number are at different logic levels.

13. A computer system, comprising:
    (a) a processor having an integer execution core containing at least one execution pipeline for executing integer instructions and a floating point execution core containing at least one execution pipeline for executing floating point instructions, the processor capable of addressing segments of system memory coupled thereto;

(b) system memory for storing integer and floating point instructions including instructions for accessing the system memory;

(c) the processor including instruction fetch logic that fetches integer and floating point instructions from the system memory; and (d) the processor further including logic circuitry for converting negative numbers from floating point notation to integer notation, including:

(i) a shifter that receives a number in floating point notation and shifts a fraction portion of the received number as a function of an exponent portion thereof to yield a shifted fraction portion and rounding data, (ii) a one's complementer, coupled to the shifter, that inverts the shifted fraction portion to yield an unincremented inverted shifted fraction portion, (iii) an incrementer, coupled to the one's complementer, that increments the unincremented inverted shifted fraction portion to yield an incremented inverted shifted fraction portion, and (iv) a multiplexer, coupled to the one's complementer and the incrementer, that selects one of the unincremented inverted shifted fraction portion and the incremented inverted shifted fraction portion based on the rounding data thereby to yield the received number in integer notation.

14. The computer system as recited in claim 13 wherein the logic circuitry further includes a second multiplexer, interposed between the one's complementer and the incrementer, that selects one of the shifted fraction portion and the inverted shifted fraction portion based on a sign of the received number.

15. The computer system as recited in claim 13 wherein the logic circuitry further included rounding logic, coupled to the shifter, that receives the rounding data and derives therefrom a rounding indicator, the multiplexer selecting the one of the unincremented inverted shifted fraction portion and the incremented inverted shifted fraction portion based on the rounding indicator.

16. The computer system as recited in claim 15 wherein the logic circuitry further includes an exclusive OR gate that receives the rounding indicator and a sign of the number and causes the multiplexer to select the incremented inverted shifted fraction portion when the rounding indicator and the sign are at different logic levels.

17. A method of operating a computer system, comprising the steps of:

(a) applying power to a processor having an integer execution core containing at least one execution pipeline for executing integer instructions and a floating point execution core containing at least one execution pipeline for executing floating point instructions, the processor capable of addressing segments of system memory coupled thereto;

(b) storing integer and floating point instructions in a system memory, the instructions including instructions for accessing the system memory;

(c) fetching integer and floating point instructions from the system memory; and (d) executing instructions in the processor, the processor further including logic circuitry for converting negative numbers from floating point notation to integer notation, including:

(i) a shifter that receives a number in floating point notation and shifts a fraction portion of the received number as a function of an exponent portion thereof to yield a shifted fraction portion and rounding data, (ii) a one's complementer, coupled to the shifter, that inverts the shifted fraction portion to yield an unincremented inverted shifted fraction portion, (iii) an incrementer, coupled to the one's complementer, that increments the unincremented inverted shifted fraction portion to yield an incremented inverted shifted fraction portion, and (iv) a multiplexer, coupled to the one's complementer and the incrementer, that selects one of the unincremented inverted shifted fraction portion and the incremented inverted shifted fraction portion based on the rounding data thereby to yield the received number in integer notation.

18. The method as recited in claim 17 wherein the logic circuitry further includes a second multiplexer, interposed between the one's complementer and the incrementer, that selects one of the shifted fraction portion and the inverted shifted fraction portion based on a sign of the received number.

19. The method as recited in claim 17 wherein the logic circuitry further includes rounding logic, coupled to the shifter, that receives the rounding data and derives therefrom a rounding indicator, the multiplexer selecting the one of the unincremented inverted shifted fraction portion and the incremented inverted shifted fraction portion based on the rounding indicator.

20. The method as recited in claim 19 wherein the logic circuitry further includes an exclusive OR gate that receives the rounding indicator and a sign of the number and causes the multiplexer to select the incremented inverted shifted fraction portion when the rounding indicator and the sign are at different logic levels.

* * * * *